United States Patent [19]

Davis et al.

[11] 4,146,655
[45] Mar. 27, 1979

[54] METHOD FOR ENCAPSULATING A SEMICONDUCTOR DIODE

[75] Inventors: Earl K. Davis, Tempe; Richard L. Greeson, Scottsdale, both of Ariz.

[73] Assignee: Motorola, Inc., Schaumburg, Ill.

[21] Appl. No.: 919,027

[22] Filed: Jun. 26, 1978

Related U.S. Application Data

[62] Division of Ser. No. 756,574, Jan. 3, 1977, abandoned.

[51] Int. Cl.$^2$ .................... C03C 3/10; H01L 23/30
[52] U.S. Cl. .......................................... 427/93; 106/53
[58] Field of Search ................ 427/93, 82; 106/53

[56] References Cited

U.S. PATENT DOCUMENTS

| | | | |
|---|---|---|---|
| 2,393,448 | 1/1946 | Armistead | 106/53 |
| 2,643,020 | 6/1953 | Dalton | 106/53 |
| 3,303,399 | 2/1967 | Hoogendoorn et al. | 427/93 |
| 3,533,832 | 10/1970 | De Volder | 427/93 |
| 3,545,989 | 12/1970 | Mikoda et al. | 106/39.6 |
| 3,546,013 | 12/1970 | Perri et al. | 427/93 |
| 3,752,701 | 8/1973 | Morrissey | 427/93 |

*Primary Examiner*—O. R. Vertiz
*Assistant Examiner*—Mark Bell
*Attorney, Agent, or Firm*—John A. Fisher

[57] ABSTRACT

An improved method for encapsulating a semiconductor diode wherein a semiconductor chip and a pair of leads are surrounded by an insulating glass. The improvement comprising the providing of an alkaline free low temperature encapsulating glass for semiconductors consisting essentially of 11–15 weight percent silica, 7–11 weight percent alumina, 63–68 weight percent lead oxide, 4–10 weight percent lead fluoride and 5–10 weight percent borate.

3 Claims, No Drawings

METHOD FOR ENCAPSULATING A SEMICONDUCTOR DIODE

This is a division, of application Ser. No. 756,574, filed Jan. 3, 1977, now abandoned.

BACKGROUND OF THE INVENTION

This invention relates to a method for encapsulating a semiconductor diode and more particularly to a method which uses a low temperature alkali free glass for encapsulating diodes, particularly zener diodes.

In the U.S. Pat. No. 3,723,835, there is disclosed a glass composition for the encapsulation of zener diodes which is essentially a 60-70 weight percent lead oxide, 8-12 weight percent borate, 8-15 weight percent silica, 1-8 weight percent alumina, 1-8 weight percent zinc oxide and 1-7% titanium oxide. The composition may include some magnesia. While the composition of this patent has been satisfactory for the purpose of encapsulating semiconductor diodes, a problem is encountered in the discoloration sticking of the encapsulating glass to the graphite boat in which it is held while being sealed.

A major object of this invention is to provide a method for encapsulating semiconductor diodes which includes providing a glass which essentially eliminates the sticking problem while maintaining the other desirable characteristics of the previous glass composition.

SUMMARY OF THE INVENTION

In accordance with the present invention, there is provided an approved alkali free low temperature encapsulating glass consisting essentially of the following: (In weight percent)

| | |
|---|---|
| $SiO_2$ | 11-15 |
| $Al_2O_3$ | 7-11 |
| PbO | 63-68 |
| $PbF_2$ | 4-10 |
| $B_2O_3$ | 5-10 |

COMPLETE DESCRIPTION

As shown and described in the above-referred-to patent, a glass encapsulated semiconductor device generally comprises a semiconductor chip or die stack deposed between two leads, the leads having attached thereto a pair of beads which seal to a glass sleeve which surrounds the entire unit. In the manufacture of this assemblage, the glass beads are typically affixed to the pair of leads and then the leads, beads, semiconductor chip and sleeve assembled together. The assemblage is placed in a graphite tray or boat for movement through a conveyor type furnace to elevate the temperature of the glass bead and the glass sleeve to the sealing temperature for the glass sleeve and beads.

It was found with the previous glass that where the sealing temperature was reached there was a sticking of the glass to the graphite boat accompanied by some blackening of the glass which is considered to be a lead reduction. It is therefore desirable that the sealing temperature of the glass be reduced below that of the glass referred to in the previous patent.

If the glass sealing temperature were reduced, for example, by an increase in the borate or lead oxide content thereof, this softening of the glass would be at the expense of resistance to lead reduction. By an introduction of lead fluoride (substituted for a portion of the lead oxide of the previous composition) it has been found that the glass can be softened enough to meet the sealing needs, but can also be softened further to permit an increase in silica plus alumina content to improve resistance to lead reduction. Thus, the present glass composition is shown as follows in weight percent:

| | |
|---|---|
| $SiO_2$ | 11-15 |
| $Al_2O_3$ | 7-11 |
| PbO | 63-68 |
| $PbF_2$ | 4-10 |
| $B_2O_3$ | 5-10 |

Two examples of the improved encapsulating glass and their physical characteristics are shown in the following table.

Table 1

| Components | Example 1 | Example 2 |
|---|---|---|
| $SiO_2$ | 13 | 13 |
| $Al_2O_3$ | 9 | 7 |
| PbO | 67 | 64 |
| $PbF_2$ | 5 | 8 |
| $B_2O_3$ | 6 | 8 |
| | 100 | 100 |
| Thermal Expansion Coefficient (ave. 25-300° C) | $81 \times 10-7/°$ C. | $83 \times 10-7/°$ C. |
| Softening Point ($10^{7.6}$poises) | 481° C. | 448° C. |
| Anneal Point ($10^{13.0}$poises) | 393° C. | 371° C. |
| Strain Point ($10^{14.5}$poises) | 373° C. | 353° C. |
| Specific Gravity | 5.30 | 5.33 |

To manufacture the glass the quantities of raw material used for the batches were the following (in grams) for a production size melt.

TABLE 2

| | Example 1 | Example 2 |
|---|---|---|
| Lead Silicate (85% PbO) | 46,660 | 44,400 |
| Sand ($SiO_2$) | 1,320 | 1,660 |
| 75% Red Lead (Balance PbO) | 3,260 | 3,260 |
| Lead Fluoride ($PbF_2$) | 3,200 | 5,120 |
| Hydrated Alumina ($Al(OH)_3$) | 8,815 | 6,855 |
| Boric Acid ($H_3BO_3$) | 6,820 | 9,095 |
| | 70,075 | 70,390 |

Both of the above batches, theoretically hold 64,000 grams of the final glass forming oxides. The batches are melted in a platinum crucible at 1,050° C., while stiring for approximately 2 hours to insure uniformity of the constituents. The glass is then fritted by draining the platinum crucible between two water cooled rollers spaced about 0.030" apart. This leaves the glass in the form of a thin frit that may be readily ground to make beads and sleeves by a preform process or remelted for drawing and cutting to provide sleeves.

Example 1 and 2 type sleeves were sealed to Dumet lead wires in a belt furnace having a temperature profile at below 550° C., and Example 2 sleeves were found to seal at about 20° C. lower temperature than Example 1 sleeves. Both of the temperatures are below that of the composition of the previous patent. Preforms of both examples were found to be acceptable for resistance to lead reduction during sealing in graphite fixtures in a nitrogen atmosphere. When the Example 2 glass was mixed with 15 weight percent alumina, the seal temperature is close to that of the Example 1 glass alone. The alumina addition to the Example 2 glass increased the Modulus of Rupture value from 5,000 to 7,700 psi on 2" long bars that are one fourth" square. The Example 2 bars were made by pressing the bar from ground glass and putting the bar into a 520° C. furnace for 20 minutes followed by annealing. For the Example 2 glass with an alumina mix, a temperature of 540° C. was used. In both cases, the bars were prepared for the Modulus of Rupture testing by grinding flat.

What is claimed is:

1. In a method of encapsulating a semiconductor diode wherein a semiconductor chip and a pair of leads are surrounded by an insulating glass, the improvement comprising the step of:

providing an alkali free low temperature encapsulating glass consisting essentially of 11–15 weight percent silica, 7–11 weight percent alumina, 63–68 weight percent lead oxide, 4–10 weight percent lead fluoride, and 5–10 weight percent borate.

2. A method as recited in claim 1 wherein the glass composition is, in weight percent:

| | |
|---|---|
| $SiO_2$ | 13 |
| $Al_2O_3$ | 9 |
| $PbO$ | 67 |
| $PbF_2$ | 5 |
| $B_2O_3$ | 16 |
| | 100 |

3. A method as recited in claim 1 wherein the glass composition is, in weight percent:

| | |
|---|---|
| $SiO_2$ | 13 |
| $Al_2O_3$ | 7 |
| $PbO$ | 64 |
| $PbF_2$ | 8 |
| $B_2O_3$ | 8 |
| | 100 |

* * * * *